United States Patent [19]

Mallory et al.

[11] Patent Number: 4,694,380
[45] Date of Patent: Sep. 15, 1987

[54] CARRIER TRAY FOR CIRCUIT BOARD

[75] Inventors: Robert L. Mallory, Portland; Alfred H. Schamel, West Linn, both of Oreg.; Stephen M. Sekel, Vancouver, Wash.

[73] Assignee: Tektronix, Inc., Beaverton, Oreg.

[21] Appl. No.: 873,000

[22] Filed: Jun. 11, 1986

[51] Int. Cl.⁴ .............................................. H05K 9/00
[52] U.S. Cl. ................................... 361/424; 206/485; 206/487; 361/413; 361/415
[58] Field of Search .................... 206/329, 485–487; 211/41; 361/412–415, 424

[56] References Cited

U.S. PATENT DOCUMENTS 3,231,785 1/1966 Calabro ................................ 361/415
3,506,877 4/1970 Owen .................................... 361/424
3,541,396 11/1970 Cardwell et al. ................... 361/412

Primary Examiner—A. D. Pellinen
Assistant Examiner—Gregory D. Thompson
Attorney, Agent, or Firm—Robert L. Harrington

[57] ABSTRACT

A carrier tray for circuit board assemblies. A metal plate is provided (by spot molding) with non-conductive plastic rails. Fastening means are molded into the rails to accommodate variations of circuit board assemblies. Locating posts in combination with resilient locking fingers and circuit board edge receiving slots are formed in the rails to provide a fastening system that is independent of separate fasteners and tools therefor. Lifting levers, also molded into the upper rail, provide for easy removal of the carrier tray from its interconnected position in a card cage.

5 Claims, 6 Drawing Figures

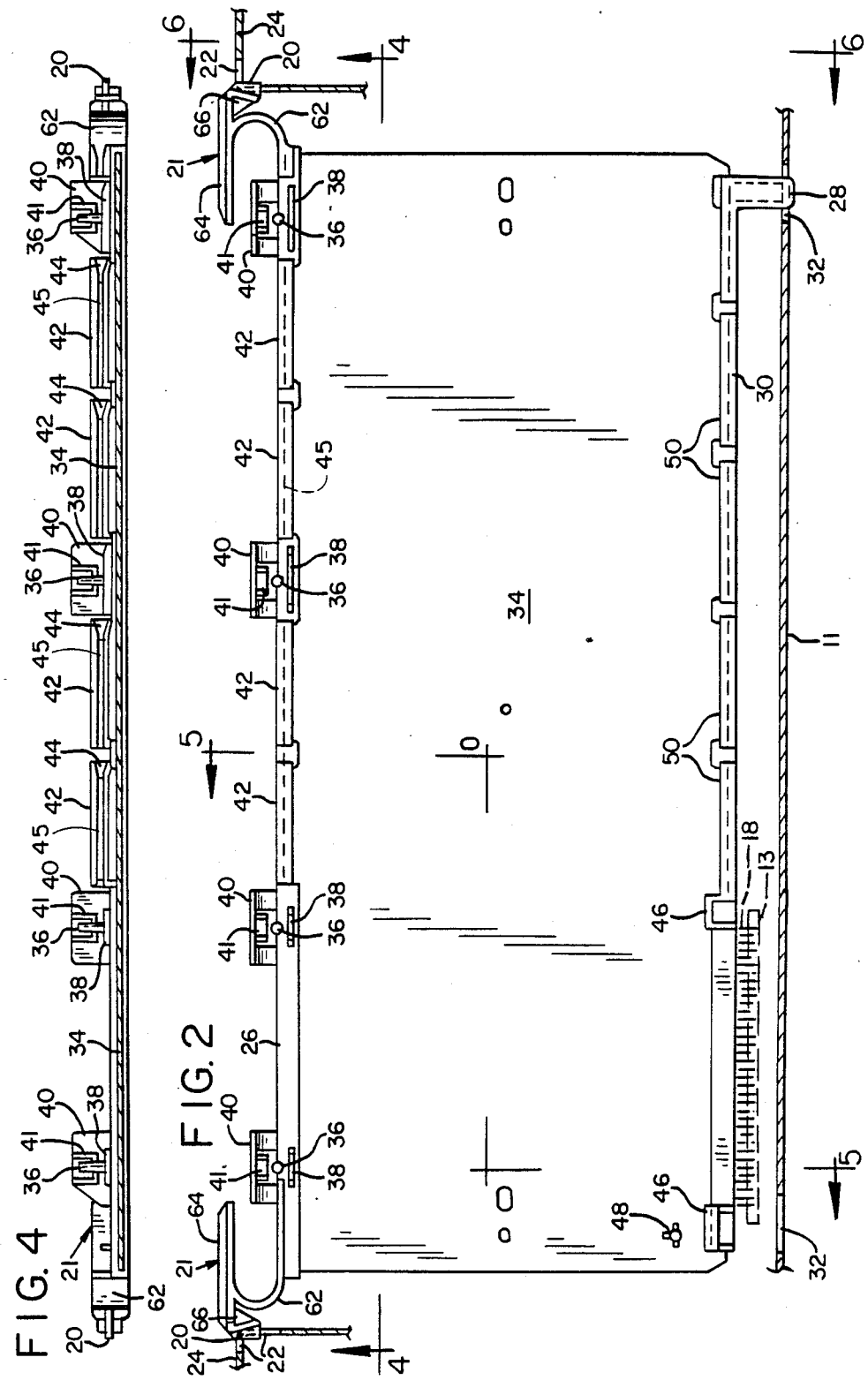

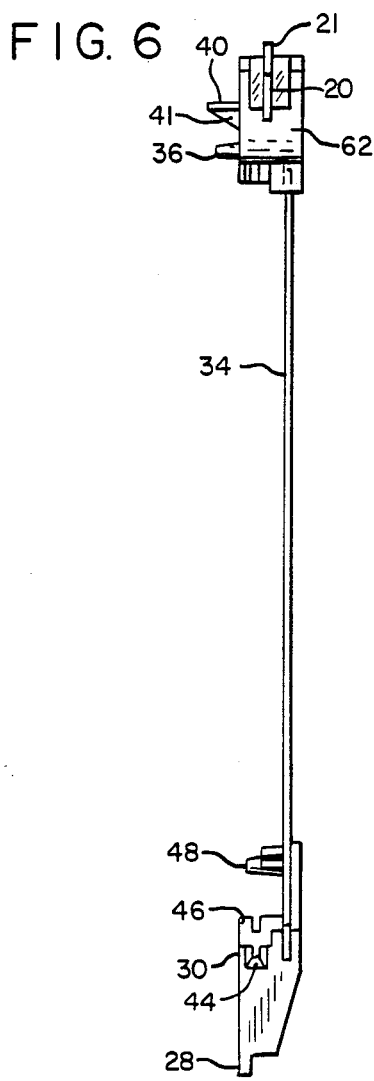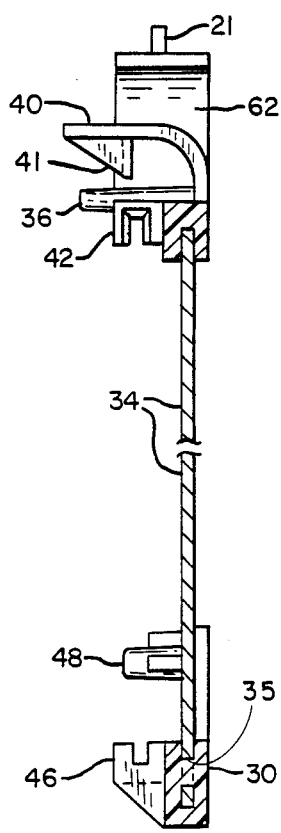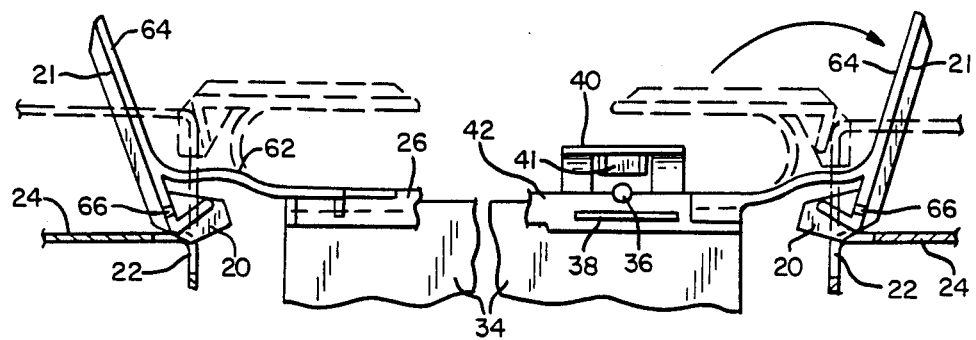
FIG. 6
FIG. 5
FIG. 3

CARRIER TRAY FOR CIRCUIT BOARD

FIELD OF INVENTION

This invention relates to a carrier tray for circuit board assemblies, and more particularly as related to electrical equipment wherein the carrier tray functions to shield the circuit board assembly and facilitate mounting thereof into the equipment.

BACKGROUND OF THE INVENTION

A general objective of the electrical equipment manufacturing industry (e.g., manufacturers of computerized testing equipment for testing performance of automobile engines) is to reduce production costs without sacrificing performance. The cost of producing the various components of such equipment has been dramatically reduced over the years. However, the assembling of the components into the equipment has remained high.

SUMMARY OF THE INVENTION

It is an objective of this invention to reduce the assembly time of electrical equipment by providing a novel carrier tray that comprises a metal backing plate designed to shield the circuit board assembly from adjacent circuit board assemblies. The tray is provided with non-conductive upper and lower rails attached to the bottom and top edges of the metal plate. The rails are molded in a manner to incorporate integral fastening means for fastening a circuit board assembly along the side of and spaced from the plate. Also, the carrier tray is adapted for mounting the carrier tray and circuit board assembly fastened thereto into a card cage, in spaced and insulated relation to other circuit board assemblies similarly fastened to carrier trays.

The circuit board assembly is securely fastened to the plastic rails without separate fasteners (e.g., screws) and the circuit board assembly and carrier tray is readily inserted into position in the equipment, again without separate fasteners. Removal of the assembly is achieved with lifting levers, also molded into the rails. The entire assembly of the equipment components is achieved without separate fasteners and tools therefore in a matter of seconds as compared to several minutes required in prior assembling procedures.

BRIEF DESCRIPTION OF THE DRAWINGS

The invention will be more clearly understood and appreciated from the following detailed description, with reference to the drawings provided herewith wherein;

FIG. 2 is a side view of the carrier tray illustrating the carrier tray, but without the circuit board assembly, mounted into the card cage;

FIG. 3 illustrates lifting levers molded into the upper rail of the carrier tray, and the procedure for using the lifting levers to remove the carrier tray from the card cage;

FIG. 4 is a section view taken on section line 4—4 of FIG. 2 but with the card cage portion deleted;

FIG. 5 is a section view taken on view line 5—5 of FIG. 2 but with the card cage portion deleted and;

FIG. 6 is an end view as taken on view line 6—6 of FIG. 2 but with the card cage portion deleted.

DESCRIPTION OF THE PREFERRED EMBODIMENT

Figure 1:
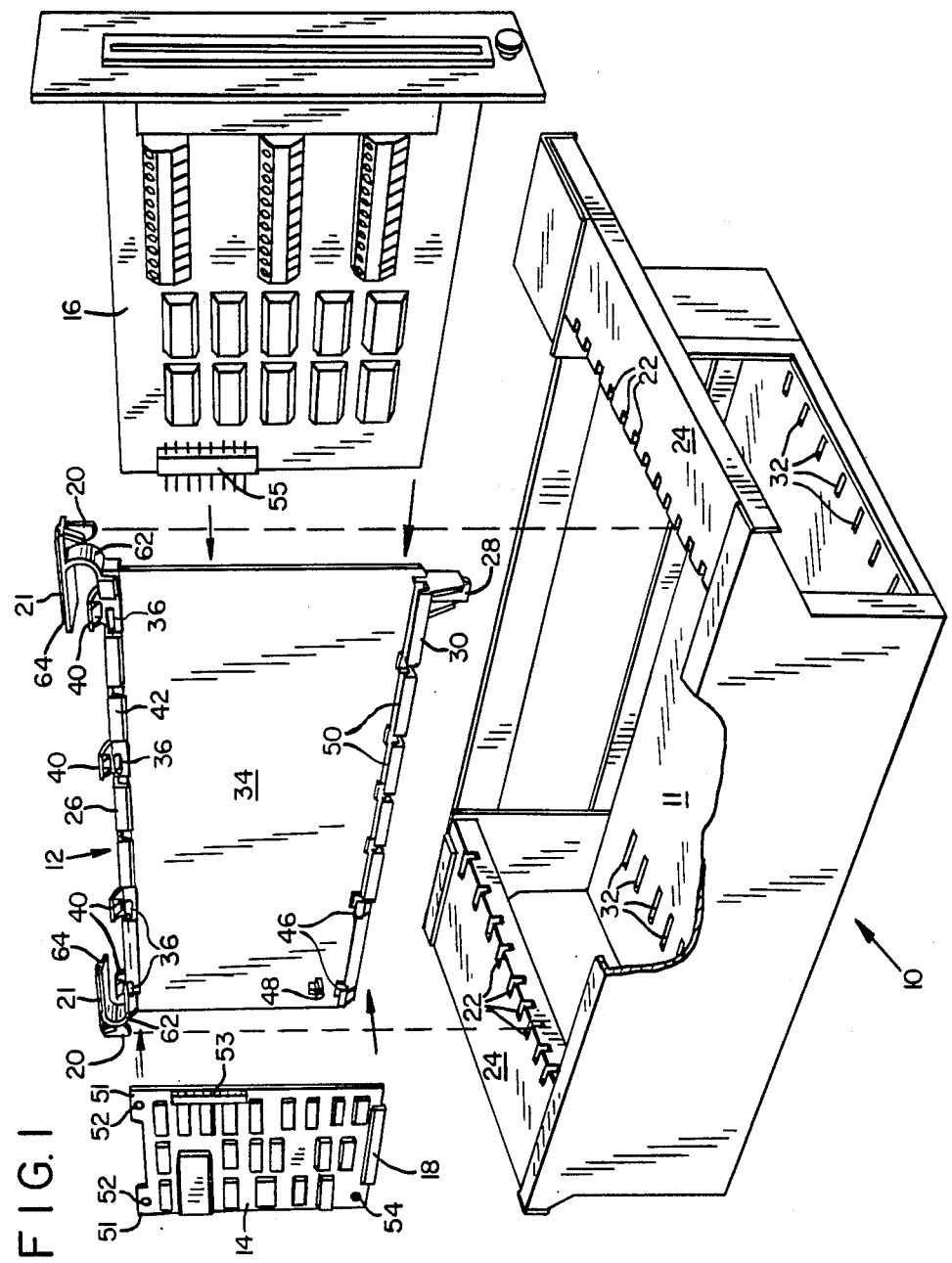
FIG. 1 is a perspective, exploded view of a circuit board carrier tray of the invention and illustrating the manner of first mounting a circuit board assembly to the tray, and then the combination circuit board assembly and carrier tray into the card cage of electrical equipment.

Reference is made to FIGS. 1 and 2. The electrical equipment contemplated for the illustrated apparatus includes a metal card cage 10 that essentially encloses the various components including the illustrated carrier tray 12 and circuit boards 14 and 16 (which circuit boards are, in combination, referred to as a circuit board assembly). With the components properly assembled in the card cage 10, a metal cover (not shown) completes the enclosure and the entire assembly is shrouded in a plastic overcover (also not shown).

The card cage and its design is not separately a part of this invention. However, the reader will appreciate that a main circuit board is horizontally mounted adjacent the bottom wall 11 of the card cage with connectors 13 (FIG. 2) facing upwardly in the card cage. Downwardly projected connector 18 on the bottom of the circuit board 14 is adapted to interconnect with the connector 13 of the main circuit board. (Connectors 13 and 18 are shown in phantom lines only in FIG. 2. It will be understood that connector 13 is a part of the main circuit board and connector 18 is a part of circuit board 14, not otherwise shown in FIG. 2.)

The circuit board 14 being attached to the carrier plate 12 is guided into the connector 13 by locating fins 20, formed in lifting levers 21, which in turn are provided on the upper rail 26. The locating fins 20 are inserted in slots 22 in the circuit board support bars 24 of the card cage, and tongue 28 on the end of lower rail 30 (opposite connector 18) is inserted into a receiving slot 32 in the bottom wall 11. Thus the circuit board carrier tray 12 is secured to the card cage via the fins 20 in card cage slots 22, the connections between connectors 13 and 18, and by the positioning of tongue 28 in receiving slot 32.

It is of particular significance to note that the circuit boards 14 and 16 are insulated from the metal card cage and connect only to the main circuit board through the connectors 13 and 18.

The structure of the carrier tray 12 will now be explained with reference to all of the drawings 1 through 6. A semi-rigid metal (conductive) plate 34 is provided in the appropriate size and shape to fit the designated position in the card cage. An upper rail 26 is attached to the top edge of the plate 34. It is molded into the desired shape and to plate 34 by spot molding, i.e., by providing holes along the edge of the plate and molding the rail directly onto the plate so that the plastic flows into and through the holes. An example of such spot welding can be seen in FIG. 5 where a hole 35 is provided adjacent the bottom edge of plate 34 with plastic material of the lower rail projected through the hole.

At four positions along the rail 26, the rail is provided (through molding) with locating posts 36, spacer ribs 38, and resilient locking fingers 40 having a ramp 41 (shown most clearly in FIGS. 4 and 5). Also molded into the rail 26 between the said locating posts (except between the two positions over the connector 18) are channel sections 42 (each provided with a flared entry 44 and a receiving slot 45 seen in FIG. 4). It will be particularly noted from FIG. 4 that the ribs 38 and slots 45 of channel sections 42 are aligned with each other and spaced from the plate 34.

The lower rail 30 is also molded directly onto the plate 34 (by spot molding). It comprises slotted holding bars 46 and a locating post 48 at positions on the end section of the carrier tray where the circuit board 14 is to be located. Whereas post 48 is not shown to be part of the rail 30 in the view of FIG. 1, reference is made to FIGS. 5 and 6 where it will be appreciated that post 48 is a part of the rail provided at the opposite side of plate 34. An accommodating hole through the plate 34 enables the post 48 to be molded out of the material of the rail 30. Channel sections 50, also provided with slots and flared entries similar to channel sections 42, are positioned on the lower rail along the remainder of its length, and tongue 28 is also molded out of the plastic rail.

Reference is now made to FIG. 1 which illustrates the procedure for mounting the circuit boards 14 and 16 to the carrier tray 12. The primary circuit board 14 contains the connector 18 and is provided with upper locating holes 52, adapted to fit the first two locating posts 36 on the upper rail 26. A lower locating hole 54 is adapted to fit post 48. The bottom edge of the circuit board is adapted to fit into the slotted holding bars 46 of the lower rail 30.

Mounting the board 14 to the carrier tray involves first the placement of the lower edge of the board into holding bars 46, aligning hole 54 with locating pin 48, and then pivoting the top edge of the circuit board back against the ramp 41 of the flexible finger members 40 at the first two positions. The camming effect of the circuit board against the ramp 41 causes the fingers to flex upwardly until the edge of the circuit board bypasses ramp 41, at which point the finger snaps down over the circuit board edge. The ramp 41 has a shoulder that is spaced from the rib 38 to accommodate the circuit board thickness and prevent removal thereof without first forcing, by bending, the fingers upwardly until the ramp 41 clears the top edge of the circuit board.

The carrier tray with mounted circuit board 14 is then aligned over the desired connector 13 of the main circuit board (superimposed over bottom wall 11, illustrated in part in FIG. 2) and lowered until locating fins 20 engage the appropriate slots 22 in the support bars 24. As the carrier tray is fully seated, interconnection of connectors 18 and 13 is completed.

Circuit board 16 is adapted to simply slide in the slots of the channel sections 42 in the upper rail 26 and channel sections 50 in the bottom rail 30 (similarly flared entries in sections 50 enable easy sliding of the board through the channels of the channel sections 50). It will be appreciated that channel sections 42 and 50 are each provided with an edge receiving slot indicated as dash lines in FIG. 2. Male and female connectors 53, 55 on the circuit boards 16 and 14 (at their abutting edges) are aligned to achieve interconnection therebetween when the circuit board 16 is fully seated in the carrier tray.

It will be appreciated that circuit boards 14 and 16 are designed to mate with the features provided in the plastic rails 26 and 30, i.e., card 14 has ear portions 51 with post receiving holes 52, and circuit board 16 has an top edge that slides through the channel sections 42 and below the posts 36 along that portion of the rail. In this use of the carrier tray, the said posts and locking fingers positioned over circuit board 16 are not used.

An alternative to the above illustrated circuit board assembly is to mount a full sized circuit board to the carrier tray (also considered a circuit board assembly in the context of the invention). In such event the circuit board will resemble an extension of circuit board 14 with additional ears 51 having post receiving holes 52 to accommodate all four posts and locking fingers. The top edge of the board between the ears 51 are below the channel sections 42 of the upper rail. The channel sections 50 in the lower rail then functions the same as the slotted holding bars 46.

A further novel feature of the carrier tray 12 is the provision of lifting lever 21, particularly illustrated in FIG. 3. The locking levers are also molded out of the plastic rail. The lifting levers include a flexible web 62, a finger grip portion 64 and a nose portion 66 on the end of the finger grip 64. The fin 20 that fits slot 22 are provided on the nose portions 66.

With the carrier plate and circuit boards mounted thereon, and with the carrier tray positioned in the card cage 10, the lifting fingers are located as illustrated in FIG. 2 (and in dash lines of FIG. 3). Note that the fins 20 are inserted in slots 22 and the nose 66 is abutted against support bars 24. The finger grips 64 are folded back over the carrier tray. When the carrier tray is to be removed, the finger grips 64 are simultaneously pivoted about web connection 62. The nose portion of the lifting levers are rolled over the bars 24 and the carrier plate is simply lifted a sufficient distance out of the card cage to disconnect connectors 18 and 13. The carrier plate can then be readily removed.

Whereas those skilled in the equipment packaging art will conceive of variations of the specific embodiment herein disclosed, the invention is intended to apply broadly to a metal plate framed in plastic rails which carry fasteners for mounting the circuit boards, more specifically defined in the claims appended hereto.

We claim:

1. A carrier tray carrying and shielding a circuit board assembly used in electrical equipment comprising; a metal plate, an upper plastic molded rail affixed to the metal plate along the top edge thereof and a lower plastic molded rail affixed to the metal plate along the bottom edge thereof, fastening means molded into the upper and lower rails, a circuit board assembly having top and bottom edges, and said fastening means fastening said top and bottom edges of the circuit board assembly to the rails in spaced relation to the metal plate.

2. A carrier tray as defined in claim 1 wherein said circuit board assembly includes a locating hole adjacent one edge thereof and said fastening means includes; a positioning post on one of the upper and lower plastic molded rails for insertion through the locating hole, a spacing rib on said one of the rails abutting the circuit board assembly and spacing it outwardly of the metal plate, and a resilient locking finger on said one of the rails which resiliently grips the said one edge of the circuit board assembly to retain the circuit board assembly on the positioning post and against the spacing rib.

3. A carrier tray as defined in claim 2 wherein said one of the rails is the upper rail, a circuit board assembly edge holding slot is formed in the lower rail receiving and holding the bottom edge of the circuit board assembly and cooperating with the locating post, spacing rib, and locking finger to provide a fully contained fastening system for mounting a circuit board assembly to the carrier tray.

4. A carrier tray as defined in claim 3 wherein the circuit board assembly is comprised of multiple circuit boards, said circuit board assembly edge holding slot, locating post, spacing rib and locking finger mount a first circuit board of said circuit board assembly, and receiving slots formed in the upper and lower rails that receive and guide a second circuit board lengthwise along the rails in abutting and interconnecting engagement with said first circuit board.

5. A carrier tray as defined in claim 4 wherein the carrier tray is adapted for mounting in a metal card cage having carrier tray support bars, said upper plastic rail including at each end thereof, a lifting lever having a support bar engaging fin, a finger grip and a flexible web portion connecting the lifting lever to said upper plastic rail and providing a pivoting of the lifting lever relative to said upper plastic rail, and thereby lifting of the carrier tray relative to the support bar.

* * * * *